US 12,464,283 B2

(12) United States Patent
Saito et al.

(10) Patent No.: US 12,464,283 B2
(45) Date of Patent: Nov. 4, 2025

(54) AUDIO SYSTEM

(71) Applicant: ALPS ALPINE CO., LTD., Tokyo (JP)

(72) Inventors: Yuji Saito, Fukushima (JP); Hiroyuki Taguchi, Fukushima (JP); Katsuhiko Egami, Fukushima (JP); Hiroki Toita, Fukushima (JP)

(73) Assignee: ALPS ALPINE CO., LTD., Tokyo (JP)

( * ) Notice: Subject to any disclaimer, the term of this patent is extended or adjusted under 35 U.S.C. 154(b) by 216 days.

(21) Appl. No.: 18/228,950

(22) Filed: Aug. 1, 2023

(65) Prior Publication Data
US 2024/0064462 A1 Feb. 22, 2024

(30) Foreign Application Priority Data

Aug. 19, 2022 (JP) ................. 2022-131277

(51) Int. Cl.
*H03G 11/00* (2006.01)
*H04R 3/00* (2006.01)
(Continued)

(52) U.S. Cl.
CPC ............... *H04R 3/007* (2013.01); *H04R 3/08* (2013.01); *H04R 9/022* (2013.01); *H04R 29/001* (2013.01); *H04R 9/06* (2013.01); *H04R 2430/01* (2013.01)

(58) Field of Classification Search
CPC .......... H04R 3/007; H04R 3/08; H04R 9/022; H04R 29/001; H04R 9/06; H04R 2430/01
(Continued)

(56) References Cited

U.S. PATENT DOCUMENTS 9,930,449 B2     3/2018   Mendes et al.
10,045,461 B1 *  8/2018   Boozer .................. H04R 3/007
(Continued)

FOREIGN PATENT DOCUMENTS

JP    2008-228214    9/2008
JP    2010-124026    6/2010
(Continued)

OTHER PUBLICATIONS

Extended European Search Report from EP 23189054.2, Jan. 4, 2024, 9 pp.

*Primary Examiner* — Ammar T Hamid
(74) *Attorney, Agent, or Firm* — Crowell & Moring LLP

(57) ABSTRACT

In implementations of an audio system, when overheating of a speaker is detected, a controller controls first and second selectors to input an audio signal output by an audio source device to a cooling processing section and cause output of the cooling processing section to be output to the speaker. In the cooling processing section, a mixer mixes an audio signal obtained by removing a low-frequency component from the input audio signal by a high-pass filter with a cooling signal at an infrasonic frequency generated by a cooling signal generator and adjusted with a gain by a gain adjuster. An audio signal obtained by mixing the audio signal with the cooling signal is output from the cooling processing section via a nonlinear inverse filter. A gain setting section sets the gain such that power of the cooling signal matches power of the low-frequency component extracted by a low-pass filter.

8 Claims, 4 Drawing Sheets

(51) Int. Cl.
  *H04R 3/08*    (2006.01)
  *H04R 9/02*    (2006.01)
  *H04R 29/00*   (2006.01)
  *H04R 9/06*    (2006.01)
(58) Field of Classification Search
  USPC .................................................. 381/55, 58
  See application file for complete search history.

(56) References Cited

U.S. PATENT DOCUMENTS

| | | | |
|---|---|---|---|
| 11,159,888 B1 | 10/2021 | Zou | |
| 2019/0166431 A1* | 5/2019 | Hare | G06F 1/206 |

FOREIGN PATENT DOCUMENTS

| | | |
|---|---|---|
| JP | 2013-225743 | 10/2013 |
| JP | 6522668 | 5/2019 |

* cited by examiner

AUDIO SYSTEM

RELATED APPLICATION

The present application claims priority to Japanese Patent Application Number 2022-131277, filed Aug. 19, 2022, the entirety of which is hereby incorporated by reference.

BACKGROUND

1. Field of the Disclosure

The present disclosure relates to a technique for suppressing overheating of a speaker in an audio system including the speaker.

2. Description of the Related Art

As a technique for suppressing overheating of a speaker in an audio system, a technique is known, which detects a temperature of a speaker by a temperature sensor and reduces a level of an audio signal to be output by the speaker when a detected temperature rise is excessive (see, for example, JP 2013-225743 A).

In addition, a technique is known, which corrects an audio signal for driving a speaker so as to eliminate distortion in an output of the speaker with respect to an input based on an equivalent circuit of the speaker (Japanese Patent No. 6522668).

Furthermore, a motional feedback technique is known, which controls driving of a speaker according to vibration detected by a sensor that detects vibration of a vibration plate of the speaker (For example, JP 2008-228214 A and JP 2010-124026 A).

It is important to suppress overheating of a speaker in order to prevent damage to the speaker and to maintain a quality of sound output from the speaker. In addition, in a case where a sensor that detects vibration of a vibration plate of a speaker is provided as described above, it is particularly important to suppress overheating of the speaker in order to prevent damage to the sensor and a device attached to the sensor and to ensure a normal operation.

Meanwhile, in the above-described technique for suppressing overheating of the speaker by reducing the level of an audio signal to be output to the speaker when a temperature rise is excessive, it is possible to suppress the generation of heat in the speaker, but it cannot be expected to quickly cool the speaker. Furthermore, when the level of the audio signal to be output to the speaker is reduced, the sound volume of audio content heard by a user is low and inconvenience and discomfort are given to the user.

SUMMARY

Accordingly, it is an objective of the present disclosure to quickly cool an overheated speaker without significantly affecting user's listening to audio content.

To achieve the objective, according to one form of the present disclosure, an audio system having a speaker and an audio source device configured to output a first audio signal includes an overheating detector configured to detect occurrence of an overheated state of the speaker; a cooling processing section configured to output a second audio signal; a switching section configured to switch an audio signal to be output to the speaker between the first audio signal and the second audio signal; and a controller configured to cause the switching section to switch the audio signal to be output to the speaker to the second audio signal when the overheating detector detects the occurrence of the overheated state of the speaker in a state in which the switching section outputs the first audio signal to the speaker. At least in a state in which the switching section outputs the second audio signal to the speaker, the cooling processing section outputs, as the second audio signal, a signal obtained by mixing a signal obtained by removing a low-frequency component from the first audio signal output by the audio source device with a cooling signal at an infrasonic frequency lower than an audible frequency range.

The audio system described above may further include a sensor attached to the speaker and configured to detect vibration of a vibration system of the speaker, and a signal corrector configured to correct the first audio signal. The switching section may switch the audio signal to be output to the speaker between the first audio signal corrected by the signal corrector and the second audio signal. The signal corrector may correct the first audio signal output by the audio source device so as to cancel distortion of output of the speaker based on the vibration detected by the sensor.

In addition, the audio system described above may include a temperature detector configured to detect a temperature of the speaker. When the temperature detector detects a temperature higher than a first threshold value, the overheating detector may detect the occurrence of the overheated state of the speaker. When the temperature detector detects a temperature equal to or lower than a second threshold value equal to or lower than the first threshold value in a state in which the switching section outputs the second audio signal to the speaker, the controller may cause the switching section to switch the audio signal to be output to the speaker to the first audio signal.

In general, in a case where an input voltage does not change, deformation of the vibration plate due to an audio signal in an infrasonic frequency range lower than the lower limit of the audible frequency range is larger than that due to an audio signal in a frequency range higher than a resonance frequency of the speaker.

Therefore, according to forms of the audio system that outputs the second audio signal mixed with the cooling signal at the infrasonic frequency to the speaker when the speaker becomes the overheated state, it is possible to vibrate the vibration plate of the speaker at an amplitude larger than that when the first audio signal is output to the speaker. Therefore, it is possible to generate greater air flow in the speaker and more powerfully and quickly cool the speaker by the air flow.

In addition, while the second audio signal mixed with the cooling signal is output to the speaker, the output of a high-frequency component, which has high auditory manifestation and is included in the audio signal output by the audio source device, from the speaker is maintained, the cooling signal mixed with the output of the speaker is at a frequency lower than the lower limit of the audible frequency range and cannot be heard by a user. Therefore, it is also possible to prevent the cooling signal from significantly affecting user's listening to audio content represented by the first audio signal output by the audio source device.

In addition, in the audio system described above, the cooling processing section may include a gain adjuster configured to adjust a gain for the cooling signal such that power of the cooling signal output from the gain adjuster matches power of the low-frequency component of the first audio signal output by the audio source device.

In this case, the mixing with the cooling signal can prevent the power of the overall second audio signal input to the speaker from being higher than the power of the first audio signal when the first audio signal is output by the audio source device to the speaker without being changed, and can prevent the speaker from being further heated.

In addition, in forms of the audio system described above, the cooling processing section may include a nonlinear inverse filter configured to correct the second audio signal to be output by the cooling processing section so as to cancel nonlinear distortion of the speaker.

In this case, it is possible to reduce an effect of the nonlinear distortion of the speaker on the audible frequency range. The effect of the nonlinear distortion of the speaker on the audible frequency range is normally noticeable when the vibration plate of the speaker is greatly vibrated.

As described above, according to forms of the present disclosure, it is possible to quickly cool the overheated speaker without significantly affecting user's listening to audio content.

DETAILED DESCRIPTION

Figure 1:
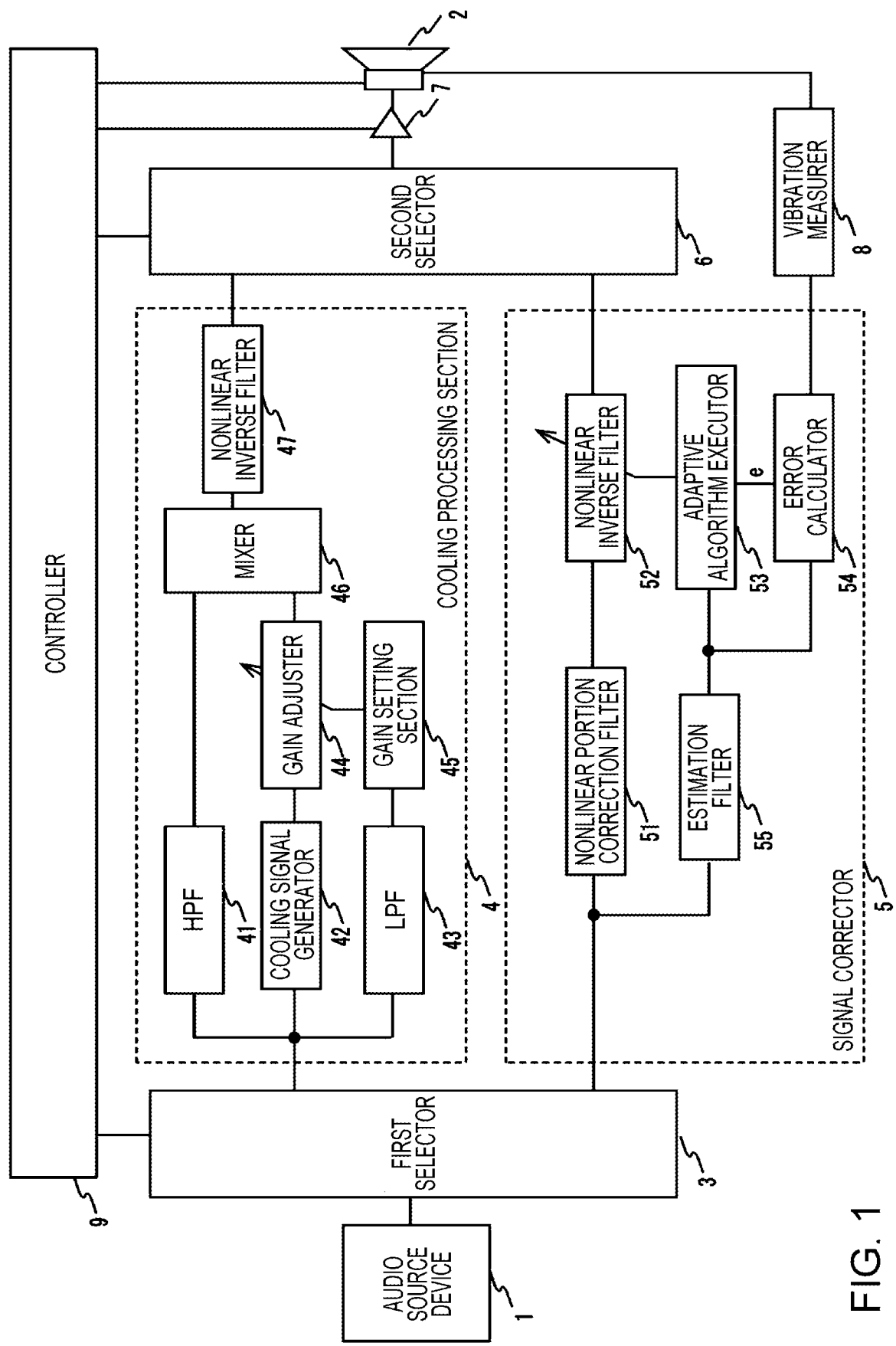
FIG. 1 is a diagram illustrating one form of a configuration of an audio system.

FIG. 1 illustrates one form of a configuration of an audio system.

As illustrated in FIG. 1, the audio system includes an audio source device 1, a speaker 2, a first selector 3, a cooling processing section 4, a signal corrector 5, a second selector 6, an amplifier 7, a vibration measurer 8, and a controller 9. In some implementations, one or more of the first selector 3, the cooling processing section 4, the signal corrector 5, the second selector 6, the amplifier 7, the vibration measurer 8, and the controller 9 may be implemented through the use of hardwired circuitry and/or through a processor, central processing unit (CPU), and/or other types of circuitry configured to execute instructions stored in a computer-readable storage medium such as a memory.

The audio source device 1 outputs a digital audio signal of audio content such as music content. The amplifier 7 is provided for driving the speaker 2. The vibration measurer 8 measures vibration and deformation of a vibration system of the speaker 2.

In this configuration, the first selector 3 outputs, to one of the cooling processing section 4 and the signal corrector 5, the audio signal input from the audio source device 1 under control by the controller 9.

The cooling processing section 4 outputs, to the second selector 6, an audio signal obtained by mixing a cooling signal with an audio signal obtained by removing a low-frequency component from the audio signal input from the first selector 3. The signal corrector 5 corrects the audio signal input from the first selector 3 so as to cancel distortion of output of the speaker and outputs the corrected audio signal to the second selector 6.

The second selector 6 outputs, to the amplifier 7, one of the audio signal input from the cooling processing section 4 and the audio signal input from the signal corrector 5 under control by the controller 9. The amplifier 7 converts the audio signal input from the second selector 6 into an analog signal (voltage signal) and amplifies the analog signal so as to drive the speaker 2.

Figure 2A:
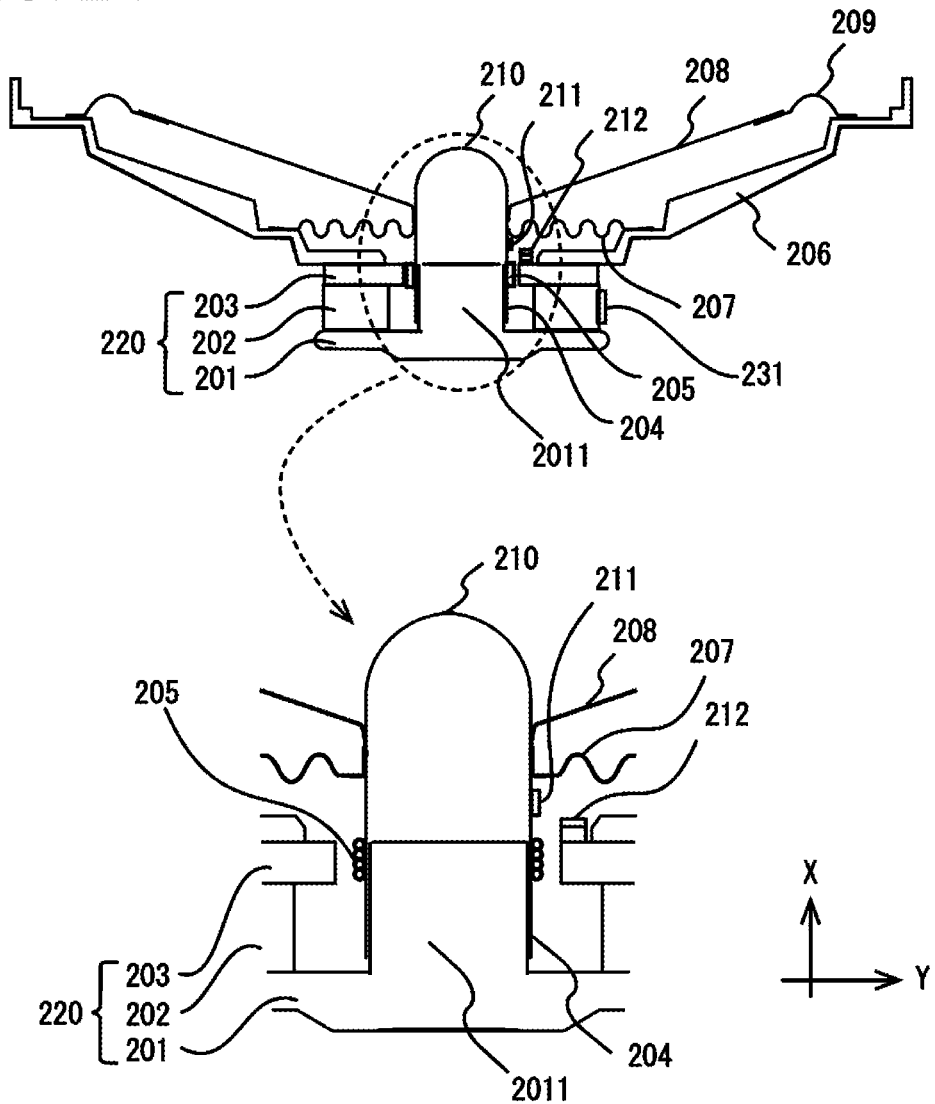
FIGS. 2A and 2B are diagrams illustrating one form of a configuration for detecting vibration.

FIG. 2A illustrates a configuration of the speaker 2.

As illustrated in FIG. 2A, the speaker 2 includes a yoke 201, a magnet 202, a top plate 203, a voice coil bobbin 204, a voice coil 205, a frame 206, a damper 207, a vibration plate 208, an edge 209, and a dust cap 210.

While the upper side of FIG. 2A is the front side of a front speaker, the lower side of FIG. 2A is the rear side of the front speaker. The yoke 201 has a protrusion 2011 at a central portion of the yoke 201. The protrusion 2011 protrudes toward the front side. The annular magnet 202 is disposed around an outer peripheral portion of the protrusion 2011. The annular top plate 203 is disposed on the magnet 202. The top plate 203 is made of a conductive member such as iron. The yoke 201, the magnet 202, and the top plate 203 form a magnetic circuit 220.

The voice coil bobbin 204 has a hollow cylindrical shape, and the voice coil 205 is wound around the voice coil bobbin 204. A signal is applied to the voice coil 205 from the amplifier 7. The protrusion 2011 of the yoke 201 is inserted in a hollow of the voice coil bobbin 204 from the rear side such that the voice coil bobbin 204 can move toward the front side and the rear side with respect to the yoke 201. The voice coil 205 is disposed at a position that is between the protrusion 2011 of the yoke 201 and the top plate 203 and through which a magnetic flux generated between inner peripheral edges of the top plate 203 by the magnetic circuit 220 passes.

The vibration plate 208 has a shape similar to a side surface of a truncated cone having a height in the front-rear direction of the front speaker. An outer peripheral edge of the vibration plate 208 is coupled to a front edge of the frame 206 via the edge 209. An inner peripheral edge of the vibration plate 208 is fixed to a front edge of the voice coil bobbin 204.

In the configuration of the speaker 2, when an audio signal from the amplifier 7 is applied to the voice coil 205, the voice coil bobbin 204 vibrates toward the front side and the rear side according to the amplitude of the audio signal input from the amplifier 7 due to an electromagnetic action between a magnetic vector generated by the magnetic circuit 220 and the audio signal flowing in the voice coil 205. When the voice coil bobbin 204 vibrates, the vibration plate 208 coupled to the voice coil bobbin 204 vibrates so as to generate sound according to the input audio signal.

Figure 2B:
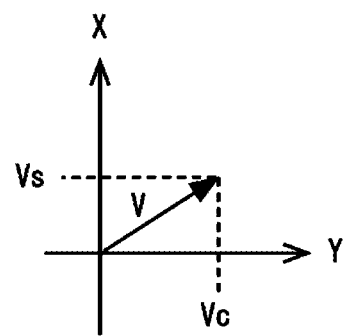

As illustrated in FIGS. 2A and 2B, the axis direction of the speaker 2 is an X direction and the radial direction of the speaker 2 is a Y direction. A deformation detection magnet 211 and a magnetic angle sensor 212 are attached to the speaker 2 and serve as a sensor that detects deformation of the vibration plate 208 in the X direction.

The deformation detection magnet 211 is fixed to the voice coil bobbin 204 such that the deformation detection magnet 211 moves upward and downward together with the voice coil bobbin 204. The magnetic angle sensor 212 is fixed onto the top plate 203 or the like such that the position of the magnetic angle sensor 212 with respect to the magnetic circuit 220 does not change.

The magnetic angle sensor 212 detects the magnitude of a component of a vector V in the X direction and the magnitude of a component of the vector V in the Y direction as illustrated in FIG. 2B. The vector V is obtained by combining a magnetic vector generated by the magnetic circuit 220 and a magnetic vector generated by the deformation detection magnet 211. The magnetic angle sensor 212 outputs, to the vibration measurer 8, an X detected value Vs representing the magnitude of the component of the vector V in the X direction and a Y detected value Vc representing the magnitude of the component of the vector V in the Y direction.

The magnitude and orientation of the combined vector V (a combination of the magnitude of the component in the X direction and the magnitude of the component in the Y direction) change according to deformation of the deformation detection magnet 211 in the X direction due to deformation of the voice coil bobbin 204. Therefore, it is possible to calculate the amount of deformation of the vibration system of the speaker 2 in the X direction from the X detected value Vs and the Y detected value Vc.

A temperature sensor 231 is attached to the magnetic circuit 220 of the speaker 2 and outputs a temperature detected by the temperature sensor 231 to the controller 9.

Returning to FIG. 1, the vibration measurer 8 measures vibration and deformation of the vibration system of the speaker 2, such as vibration and deformation of the voice coil bobbin 204 and the vibration plate 208, from the output of the magnetic angle sensor 212 of the speaker 2 and outputs the measured vibration and the measured deformation to the controller 9 and the signal corrector 5.

In addition, information of an input voltage and an input current is input to the controller 9 from the speaker 2 or the amplifier 7.

The cooling processing section 4 includes a high-pass filter 41 (HPF 41), a cooling signal generator 42, a low-pass filter 43 (LPF 43), a gain adjuster 44, a gain setting section 45, a mixer 46, and a nonlinear inverse filter 47.

The audio signal output by the first selector 3 is input to the cooling processing section 4. The audio signal input to the cooling processing section 4 is input to the high-pass filter 41 and the low-pass filter 43.

The high-pass filter 41 outputs, to the mixer 46, an audio signal obtained by removing the low-frequency component (for example, a component at a frequency equal to or lower than 50 Hz) from the input audio signal.

The low-pass filter 43 extracts the low-frequency component from the input audio signal and outputs the extracted low-frequency component to the gain setting section 45. The low-frequency component extracted by the low-pass filter 43 is the same as the low-frequency component removed by the high-pass filter 41.

The cooling signal generator 42 outputs, to the gain adjuster 44, a cooling signal (for example, a sine wave at a frequency of 10 Hz) at an infrasonic frequency lower than the lower limit (20 Hz) of the audible frequency range.

The gain adjuster 44 adjusts, to a gain set by the gain setting section 45, a gain for the cooling signal output from the cooling signal generator 42 and outputs the cooling signal to the mixer 46.

The gain setting section 45 calculates power that is an effective value of the low-frequency component input from the low-pass filter 43. The gain setting section 45 sets the gain of the gain adjuster 44 such that power of the cooling signal output from the gain adjuster 44 matches the power of the low-frequency component input from the low-pass filter 43.

The mixer 46 outputs, to the nonlinear inverse filter 47, the audio signal obtained by mixing the audio signal obtained by removing the low-frequency component and input from the high-pass filter 41 with the cooling signal input from the gain adjuster 44.

The nonlinear inverse filter 47 applies a transfer function for modifying the audio signal to the audio signal input from the mixer 46 so as to cancel nonlinear distortion of the speaker 2 and outputs the audio signal to the second selector 6.

In this case, in a state in which the first selector 3 outputs, to the cooling processing section 4, the audio signal input from the audio source device 1 and the second selector 6 outputs the audio signal input from the cooling processing section 4, the audio signal output by the audio source device 1 is processed by the cooling processing section 4, and output of the cooling processing section 4 is output to the speaker 2.

In this state, the audio signal output to the speaker 2 includes a high-frequency component of the audio signal output by the audio source device 1 and the cooling signal that is the audio signal at the infrasonic frequency.

Figure 3:
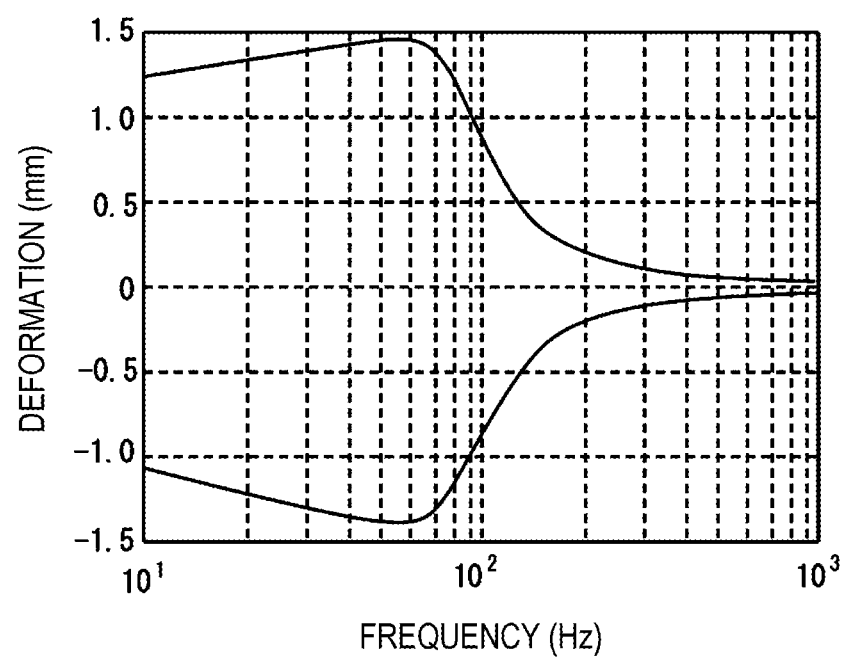
FIG. 3 is a diagram illustrating an example of deformation-frequency characteristics of a speaker.

As indicated in an example of the relationship between deformation of the vibration plate of the speaker 2 and the frequency in FIG. 3, in a case where the input voltage does not change, deformation of the vibration plate due to a signal in the infrasonic frequency range lower than the lower limit of the audible frequency range is larger than that due to a signal in a frequency range higher than the resonance frequency of the speaker 2 in general.

Therefore, when the audio signal obtained by mixing with the cooling signal at the infrasonic frequency instead of the low-frequency component of the audio signal output by the audio source device 1 is output to the speaker 2, the vibration plate 208 of the speaker 2 can be vibrated at an amplitude larger than that when the audio signal input from the audio source device 1 is output to the speaker 2 without being changed. By vibrating the vibration plate 208 of the speaker 2 at the large amplitude, it is possible to generate greater air flow in the speaker 2 and more powerfully and quickly cool the speaker 2 by the air flow.

In addition, since the gain for the cooling signal is adjusted such that the power of the cooling signal matches the power of the low-frequency component removed from the audio signal and the cooling signal is output, the power of the overall audio signal input to the speaker 2 is prevented from being higher than the power of the audio signal when the audio signal input from the audio source device 1 is output to the speaker 2 without being changed, and further heating of the speaker 2 is prevented.

In addition, while the output of the high-frequency component, which has high auditory manifestation and is included in the audio signal output by the audio source device 1, from the speaker is maintained, the cooling signal mixed with the output of the speaker 2 is at the frequency lower than the lower limit of the audible frequency range and cannot be heard by the user. Therefore, it is possible to prevent the cooling signal from significantly affecting user's listening to the audio content represented by the audio signal output by the audio source device 1.

In addition, when the vibration plate 208 of the speaker 2 is vibrated at a large amplitude by the cooling signal of the sine wave, nonlinear distortion of the speaker 2 due to nonlinear characteristics of the speaker 2, such as driving force, stiffness, and inductance, becomes larger and distortion occurs even in the audible frequency range. However, the audio signal mixed with the cooling signal is output to the speaker 2 through the nonlinear inverse filter 47 that cancels the nonlinear distortion of the speaker 2, and thus an effect caused by the nonlinear distortion of the speaker 2 is reduced.

The signal corrector 5 corrects the audio signal output by the audio source device 1 so as to eliminate output distortion caused by linear characteristics and nonlinear characteristics of the speaker 2 and outputs the corrected audio signal.

The signal corrector 5 includes a nonlinear portion correction filter 51, a linear inverse filter 52, an adaptive algorithm executor 53, an error calculator 54, and an estimation filter 55.

The audio signal output by the first selector 3 is input to the signal corrector 5. The audio signal input to the signal corrector 5 is output to the second selector 6 through the nonlinear portion correction filter 51 and the linear inverse filter 52.

When the speaker 2 is driven with the audio signal output by the nonlinear portion correction filter 51, a transfer function that cancels distortion of output of the speaker 2 caused by a nonlinear parameter of the speaker 2 with respect to the audio signal input to the signal corrector 5, that is, a transfer function that corrects the distortion caused by the nonlinear parameter of the speaker 2, is set in the nonlinear portion correction filter 51 as a transfer function (filter coefficient) of the nonlinear portion correction filter 51.

The audio signal input to the signal corrector 5 is input to the estimation filter 55. Output of the estimation filter 55 is input to the adaptive algorithm executor 53 and the error calculator 54. In addition, a transfer function representing vibration characteristics of the speaker 2 estimated in advance is set in the estimation filter 55.

The error calculator 54 uses the output of the estimation filter 55 to calculate a difference between vibration of the speaker 2 without distortion with respect to the audio signal input to the signal corrector 5 and vibration of the speaker 2 actually measured by the vibration measurer 8.

The linear inverse filter 52 is a variable filter. The linear inverse filter 52, the adaptive algorithm executor 53, and the estimation filter 55 form an adaptive filter. The adaptive algorithm executor 53 uses the output of the estimation filter 55 as a reference signal and the difference calculated by the error calculator 54 as an error to perform an adaptive operation for updating the transfer function (filter coefficient) of the linear inverse filter 52 according to the filtered-x LMS algorithm or the like so as to minimize the error.

In this case, in a state in which the first selector 3 outputs, to the signal corrector 5, the audio signal input from the audio source device 1, and the second selector 6 outputs the audio signal input from the signal corrector 5, the audio signal output by the audio source device 1 and corrected by the signal corrector 5 to eliminate distortion of output caused by the linear characteristics and nonlinear characteristics of the speaker 2 is output to the speaker 2.

Next, a cooling control process that is performed by the controller 9 is described.

Figure 4:
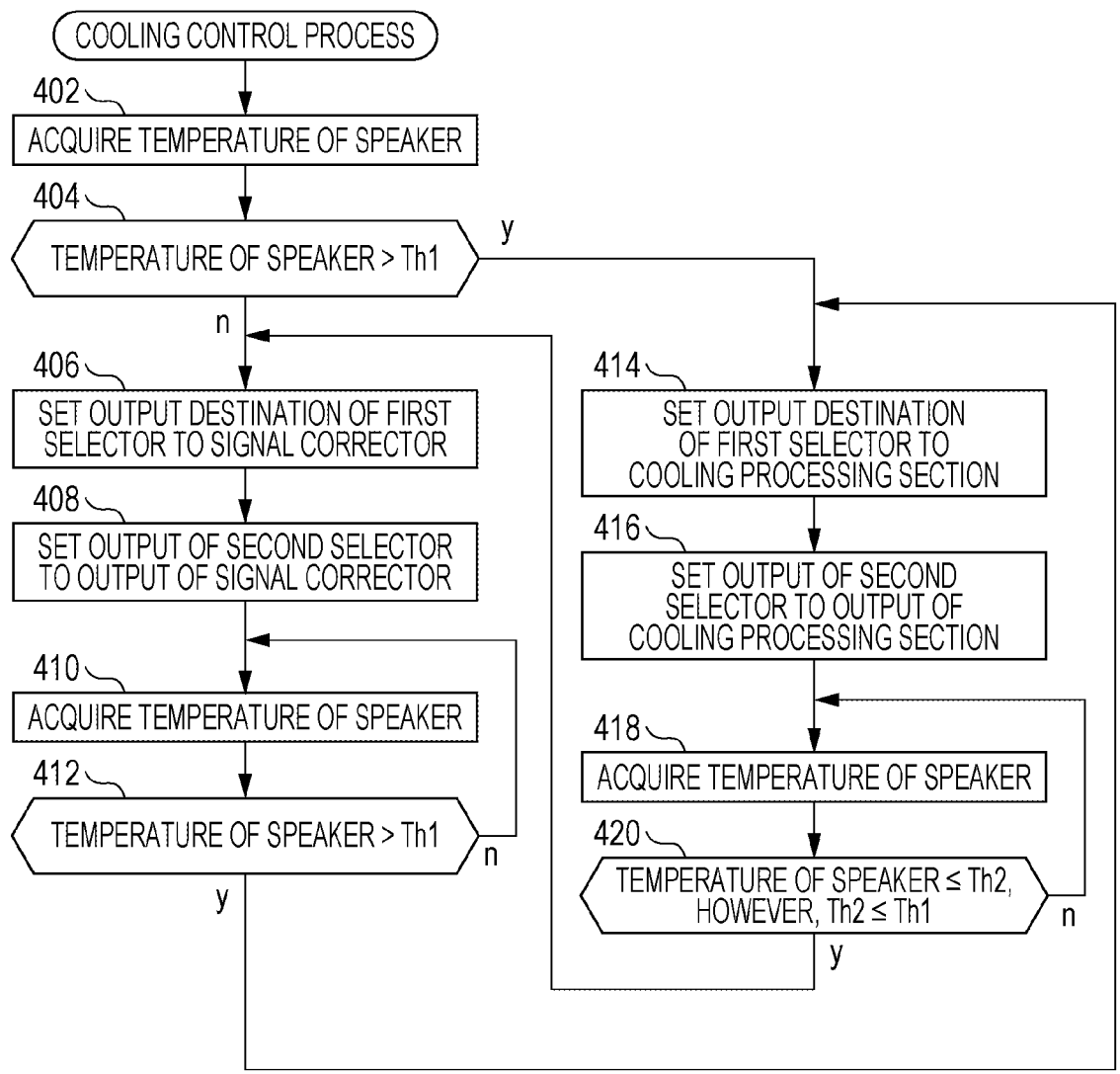
FIG. 4 is a flowchart illustrating one form of a cooling control process.

FIG. 4 illustrates a procedure for the cooling control process.

As illustrated in FIG. 4, in the cooling control process, the controller 9 acquires the temperature of the speaker 2 (step 402). The temperature of the speaker 2 may be acquired from the temperature sensor 231. However, in other implementations, the temperature of the speaker 2 may be calculated by estimating the amount of heat generated in the speaker 2 from a history of the input voltage and the input current of the speaker 2. The history is indicated in the information input to the controller 9 from the speaker 2 or the amplifier 7.

Then, the controller 9 determines whether the temperature of the speaker 2 is higher than a threshold value Th1 (step 404). The threshold value Th1 is a temperature value slightly lower than an upper limit of a temperature range in which normal operations of the speaker 2 and the magnetic angle sensor 212 are ensured.

In a case where the temperature of the speaker 2 is not higher than the threshold value Th1, the controller 9 sets, to the signal corrector 5, an output destination of the audio signal input from the audio source device 1 and to be output from the first selector 3 (step 406) and sets output of the second selector 6 to the audio signal output by the signal corrector 5 (step 408).

Thereafter, the controller 9 repeats processing of acquiring the temperature of the speaker 2 (step 410) and determining whether the temperature of the speaker 2 is higher than the threshold value Th1 (step 412) until the controller 9 determines that the temperature of the speaker 2 is higher than the threshold value Th1.

In a case where the controller 9 determines that the temperature of the speaker 2 is higher than the threshold value Th1 (step 412), the process proceeds to processing of step 414.

Meanwhile, in a case where the controller 9 determines that the temperature of the speaker 2 is higher than the threshold value Th1 in step 404, the process proceeds to processing of step 414.

When the process proceeds to step 414 from step 404 or step 412, the controller 9 sets, to the cooling processing section 4, an output destination of the audio signal input from the audio source device 1 and to be output from the first selector 3 (step 414), and sets output of the second selector 6 to the audio signal output by the cooling processing section 4 (step 416).

Then, the controller 9 repeats processing of acquiring the temperature of the speaker 2 (step 418) and determining whether the temperature of the speaker 2 is equal to or lower than a threshold value Th2 (step 420) until the controller 9 determines that the temperature of the speaker 2 is equal to or lower than the threshold value Th2.

The threshold value Th2 is equal to or lower than the threshold value Th1.

In a case where the controller 9 determines that the temperature of the speaker 2 is equal to or lower than the threshold value Th2 in step 420, the process proceeds to the processing of step 406.

One form of a cooling control process performed by the controller 9 is described above.

According forms of the cooling control process, in a case where the controller 9 determines that the temperature of the speaker 2 is higher than the threshold value Th1, the audio signal output by the audio source device 1 is processed by the cooling processing section 4 until the temperature of the speaker 2 becomes equal to or lower than the threshold value Th2, and output of the cooling processing section 4 is output to the speaker 2.

In addition, in a time period excluding a time period from when the temperature of the speaker 2 becomes higher than the threshold value Th1 to when the temperature of the speaker 2 becomes equal to or lower than the threshold value Th2, the audio signal output by the audio source device 1 is processed by the signal corrector 5 and output of the signal corrector 5 is output to the speaker 2.

As described above, the controller 9 may estimate a change in the nonlinear characteristics of the speaker 2 according to the temperature of the speaker 2 or the like and perform processing of applying the transfer function of the nonlinear inverse filter 47 of the cooling processing section 4 and the transfer function of the nonlinear portion correction filter 51 to the current nonlinear characteristics of the speaker 2 according to the estimated change.

The configuration in which the cooling processing section 4 described above is used to cool the speaker 2 can be used for an audio system not including the signal corrector 5, the vibration measurer 8, the deformation detection magnet 211, and the magnetic angle sensor 212 in a case where output of the first selector 3 is input to the second selector 6, instead of output of the signal corrector 5.

The above embodiment and implementations have been described as examples to embody the present disclosure. It should not be interpreted that the above embodiments and implementations limit the technical range of the present disclosure. That is, the present disclosure can be practiced in various other forms without departing from the spirit and main features of the present disclosure.

The invention claimed is:

1. An audio system having a speaker and an audio source device configured to output a first audio signal, the audio system comprising:
    an overheating detector configured to detect occurrence of an overheated state of the speaker;
    a cooling processing section configured to output a second audio signal;
    a switching section configured to switch an audio signal to be output to the speaker between the first audio signal and the second audio signal; and
    a controller configured to cause the switching section to switch the audio signal to be output to the speaker to the second audio signal when the overheating detector detects the occurrence of the overheated state of the speaker in a state in which the switching section outputs the first audio signal to the speaker;
    wherein at least in a state in which the switching section outputs the second audio signal to the speaker, the cooling processing section is configured to output, as the second audio signal, a signal obtained by mixing a signal obtained by removing a low-frequency component from the first audio signal output by the audio source device with a cooling signal at an infrasonic frequency lower than an audible frequency range; and
    wherein the cooling processing section includes a gain adjuster configured to adjust a gain for the cooling signal such that power of the cooling signal output from the gain adjuster matches power of the low-frequency component of the first audio signal output by the audio source device.

2. The audio system according to claim 1, further comprising:
    a sensor attached to the speaker and configured to detect vibration of a vibration system of the speaker; and
    a signal corrector configured to correct the first audio signal;
    wherein the switching section is configured to switch the audio signal to be output to the speaker between the first audio signal corrected by the signal corrector and the second audio signal; and
    wherein the signal corrector is configured to correct the first audio signal output by the audio source device so as to cancel distortion of output of the speaker based on the vibration detected by the sensor.

3. The audio system according to claim 2, wherein:
    the cooling processing section includes a gain adjuster configured to adjust a gain for the cooling signal such that power of the cooling signal output from the gain adjuster matches power of the low-frequency component of the first audio signal output by the audio source device.

4. The audio system according to claim 2, further comprising:
    a temperature detector configured to detect a temperature of the speaker;
    wherein when the temperature detector detects a temperature higher than a first threshold value, the overheating detector is configured to detect the occurrence of the overheated state of the speaker; and
    wherein when the temperature detector detects a temperature equal to or lower than a second threshold value equal to or lower than the first threshold value in a state in which the switching section outputs the second audio signal to the speaker, the controller is configured to cause the switching section to switch the audio signal to be output to the speaker to the first audio signal.

5. An audio system having a speaker and an audio source device configured to output a first audio signal, the audio system comprising:
    an overheating detector configured to detect occurrence of an overheated state of the speaker;
    a cooling processing section configured to output a second audio signal;
    a switching section configured to switch an audio signal to be output to the speaker between the first audio signal and the second audio signal; and
    a controller configured to cause the switching section to switch the audio signal to be output to the speaker to the second audio signal when the overheating detector detects the occurrence of the overheated state of the speaker in a state in which the switching section outputs the first audio signal to the speaker;
    wherein at least in a state in which the switching section outputs the second audio signal to the speaker, the cooling processing section is configured to output, as the second audio signal, a signal obtained by mixing a signal obtained by removing a low-frequency component from the first audio signal output by the audio source device with a cooling signal at an infrasonic frequency lower than an audible frequency range;
    a temperature detector configured to detect a temperature of the speaker;
    wherein when the temperature detector detects a temperature higher than a first threshold value, the overheating detector is configured to detect the occurrence of the overheated state of the speaker; and
    wherein when the temperature detector detects a temperature equal to or lower than a second threshold value equal to or lower than the first threshold value in a state in which the switching section outputs the second audio signal to the speaker, the controller is configured to cause the switching section to switch the audio signal to be output to the speaker to the first audio signal.

6. The audio system according to claim 5, wherein:
    the cooling processing section includes a gain adjuster configured to adjust a gain for the cooling signal such that power of the cooling signal output from the gain adjuster matches power of the low-frequency component of the first audio signal output by the audio source device.

7. The audio system according to claim 5, wherein:
    the cooling processing section includes a nonlinear inverse filter configured to correct the second audio signal to be output by the cooling processing section so as to cancel nonlinear distortion of the speaker.

8. The audio system according to claim 5, wherein the cooling processing section includes:
   a gain adjuster configured to adjust a gain for the cooling signal such that power of the cooling signal output from the gain adjuster matches power of the low-frequency component of the first audio signal output by the audio source device, and
   a nonlinear inverse filter configured to correct the second audio signal to be output by the cooling processing section so as to cancel nonlinear distortion of the speaker.

* * * * *